United States Patent
Landry et al.

(10) Patent No.: US 7,616,508 B1
(45) Date of Patent: Nov. 10, 2009

(54) FLASH-BASED FPGA WITH SECURE REPROGRAMMING

(75) Inventors: Joel Landry, Colorado Springs, CO (US); William Plants, Campbell, CA (US); Randall Sexton, Menlo Park, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/463,846

(22) Filed: Aug. 10, 2006

(51) Int. Cl.
*G11C 7/00* (2006.01)
*G06F 17/50* (2006.01)

(52) U.S. Cl. ............... 365/189.17; 365/189.15; 365/189.16; 365/222; 716/16

(58) Field of Classification Search ............ 365/189.05, 365/189.06, 189.07, 189.15, 189.16, 189.71, 365/222, 189.17; 716/16
See application file for complete search history.

(56) References Cited

U.S. PATENT DOCUMENTS

| | | | | |
|---|---|---|---|---|
| 4,435,786 A | * | 3/1984 | Tickle | 365/185.07 |
| 5,724,285 A | * | 3/1998 | Shinohara | 365/185.25 |
| 5,978,260 A | * | 11/1999 | Trimberger et al. | 365/182 |
| 6,088,268 A | | 7/2000 | Gupta et al. | |
| 6,847,543 B2 | * | 1/2005 | Toyoda et al. | 365/154 |
| 7,325,090 B2 | * | 1/2008 | Ronen | 711/106 |
| 7,360,068 B2 | * | 4/2008 | Borgatti et al. | 712/226 |
| 2003/0209740 A1 | * | 11/2003 | Miyamoto et al. | 257/286 |
| 2004/0005456 A1 | * | 1/2004 | Takeuchi | 428/364 |
| 2004/0034732 A1 | * | 2/2004 | Valin et al. | 711/4 |
| 2004/0061147 A1 | * | 4/2004 | Fujita et al. | 257/232 |
| 2005/0083889 A1 | * | 4/2005 | Enders et al. | 370/332 |
| 2005/0169040 A1 | * | 8/2005 | Peng et al. | 365/149 |
| 2005/0243626 A1 | * | 11/2005 | Ronen | 365/222 |
| 2006/0255832 A1 | * | 11/2006 | Speers et al. | 326/39 |
| 2007/0198786 A1 | * | 8/2007 | Bychkov et al. | 711/154 |

FOREIGN PATENT DOCUMENTS

JP      2005309543 A  * 11/2005

* cited by examiner

*Primary Examiner*—Ly D Pham
(74) *Attorney, Agent, or Firm*—Lewis and Roca LLP

(57) ABSTRACT

A flash-based programmable integrated circuit includes programmable circuitry, a flash memory array coupled to the programmable circuitry for configuring it, flash programming circuitry for programming the flash memory array, and an on-chip intelligence, such as a microcontroller or state machine, coupled to the programming circuitry to program the flash memory from off-chip data supplied via an I/O pad, or to refresh the data stored in the flash memory to prevent it from degrading.

10 Claims, 4 Drawing Sheets

FLASH-BASED FPGA WITH SECURE REPROGRAMMING

BACKGROUND OF THE INVENTION

1. Field of the Invention

The present invention relates to programmable integrated circuit devices such as field programmable gate arrays ("FPGAs"). More particularly, the present invention relates to flash-based FPGA integrated circuits having secure reprogramming features.

2. The Prior Art

Flash electrically erasable programmable read-only memory (EEPROM) systems are commonly used as non-volatile memories in many electronic devices, including programmable logic devices such as FPGAs. Although the term "flash" often refers to memories that are bulk erased on a page-by-page, sector-by-sector, or entire array basis, the term is generally used in the art to refer to any electrically erasable (and re-programmable) non-volatile memory technology, regardless of the particular erase scheme. The most common flash memory cells are comprised of floating-gate transistors, though other flash technologies such as SONOS, nano-crystal, and other non-volatile transistors are also known. Periodically, flash-based devices such as FPGA devices may be reprogrammed in the field in order to change the configuration of the device or to refresh the original program. Over time and negatively influenced by high temperature, the voltage of a flash configuration cell may degrade eventually resulting in functional failures, resulting in the need to refresh the program. Also, program changes due to technology upgrades and bug fixes, etc. can lead to a need to change the original program of a flash-based device in the field. An example of a flash-based FPGA is the ProASIC® line of products available from Actel Corporation, Mountain View, Calif.

The prior-art method to solve this problem was for a customer to reprogram the device from an external source. This required one of the following: the device be brought "in house" to be reprogrammed; a technician be sent to the customer to re-program the device; the program be stored in the system in a memory (such as a hard disk) and external system "intelligence" be used to reprogram the device; or the device be reprogrammed via a network connection such as the internet.

The first two of these alternatives are logistically difficult and expensive. The third alternative requires significant system intelligence to program the device while it is not operational. In addition, this method requires exposure of the bit stream, which may compromise security of the design. The fourth alternative also requires exposure of the bit stream, which may compromise security of the design.

Other memory technologies, such as DRAM, also require methods to refresh voltage levels to prevent loss of data. However, the methods used to refresh flash memory differ dramatically from those used to refresh other technologies.

BRIEF DESCRIPTION OF THE INVENTION

A flash-based programmable integrated circuit has on-chip intelligence to program itself from an external data source. Once the device is programmed, the actual configuration data can be used directly to refresh the device. No external control is required, no external storage of program code is required, and no exposure of the bit stream is required. The integrated circuit includes programmable circuitry, a flash memory array coupled to the programmable circuitry for configuring it, flash programming circuitry for programming the flash memory array, and an on-chip intelligence, such as a microcontroller or state machine, coupled to the programming circuitry to program the flash memory from off-chip data supplied via an I/O pad, or to refresh the data stored in the flash memory to prevent it from degrading.

A method for refreshing the flash memory of a flash-based programmable logic device includes taking the integrated circuit out of normal operating mode; setting a row counter to zero; reading the current row configuration data from the memory into local row latches; erasing all of the flash memory cells in the row; programming the memory cells in the current row from the latched row data; determining whether the current row is the last row in the memory; if the current row is not the last row in the memory, incrementing the row count and repeating the reading data, erasing the row, programming the row and determining whether the current row is the last row in the memory. If the current row was the last row in the memory, returning the integrated circuit to normal operation.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

According to the present invention, a flash-based programmable integrated circuit has on-chip intelligence to program itself from an external data source. Once the device is programmed, the actual configuration data can be used directly to refresh the device. No external control is required, no external storage of program code is required, and no exposure of the bit stream is required.

Figure 1:
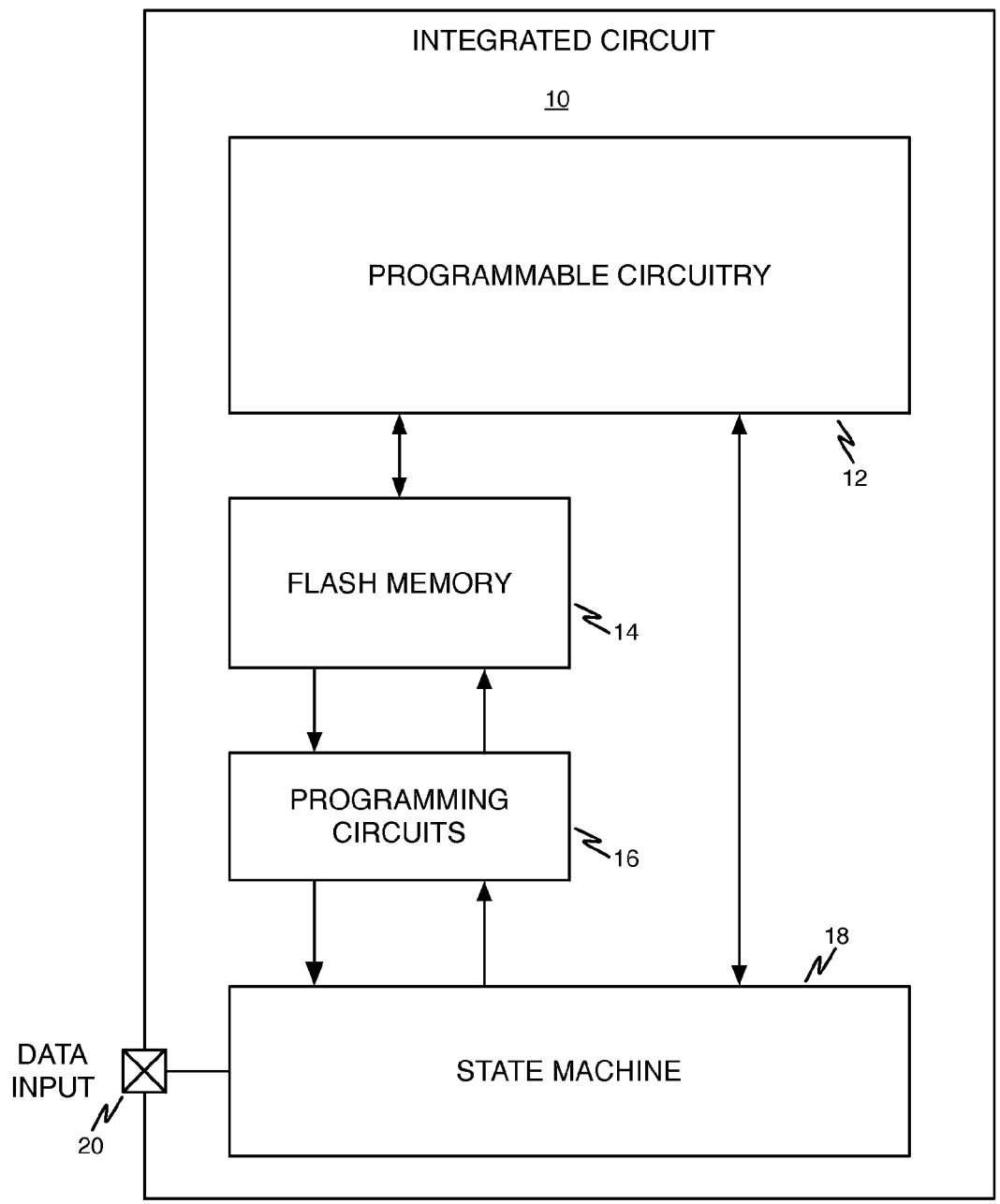
FIG. 1 is a block diagram of an illustrative flash-based programmable integrated circuit in accordance with the principles of the present invention.

Referring first to FIG. 1, a block diagram shows an illustrative flash-based programmable integrated circuit 10 in accordance with the principles of the present invention. Integrated circuit 10 includes programmable circuitry 12, such as an FPGA. Programmable circuitry 12 is configured using data from a flash memory array 14 as is known in the art. Flash memory array 14 is programmed using flash programming circuitry 16. Flash memory 14 may be configured as a separate array connected to programmable circuitry 12 and may directly control the configuration of the programmable circuitry 12 or the flash memory 14 may store configuration data that is loaded into programmable circuitry 12 and used to configure programmable elements within programmable circuitry 12 (e.g., volatile programmable logic cells such as SRAM cells). Alternatively, flash memory 14 may be embedded and distributed within programmable circuitry 12. In addition to the flash memory used to configure the programmable circuitry 12, some embodiments of the invention may include general-purpose memory circuits such as, for example, another block of flash memory or an SRAM memory block for use by the other circuit blocks on the device and/or the user.

An on-chip intelligence 18, such as a microcontroller, state machine, or other circuit block is coupled to the programming circuitry 16 in accordance with the present invention. On-chip intelligence 18 is used to program the flash memory from off-chip data supplied via I/O pad 20, or to refresh the data stored in the flash memory to prevent it from degrading. On-chip intelligence 18 may include a decryption engine to decrypt new memory configuration data supplied to the integrated circuit through I/O pad 20, using a stored key.

Figure 2:
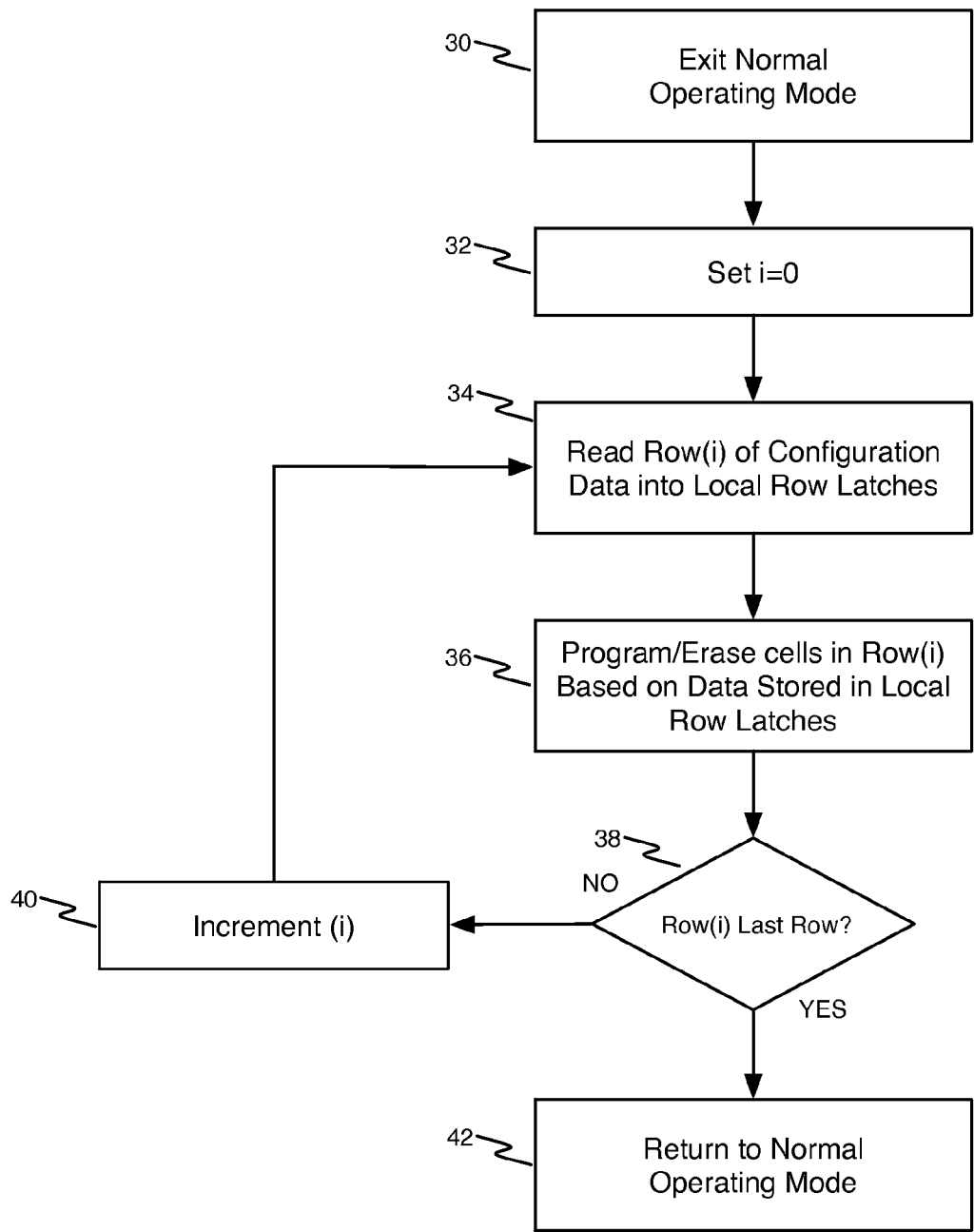
FIG. 2 is a flow chart illustrating a general flash memory reprogramming method that may be used in the integrated circuit of FIG. 1 according to the present invention.

Referring now to FIG. 2, a flow chart illustrates a general flash memory reprogramming method that may be implemented by on-chip intelligence 18 in the integrated circuit of FIG. 1 according to the present invention. This general method may be used to program the flash memory from either off-chip data or to refresh the programmed data.

First, at reference numeral 30, the integrated circuit is taken out of normal operating mode. This procedure may include several steps, including, for example, stopping the clocks, forcing the I/O into safe states, backing up the contents of core registers and RAM, and setting core power supply levels appropriately for program and erase operation. Next, at reference numeral 32, the row count (i) is set to zero.

Next, a current-row-operation including several processes is performed. At reference numeral 34, row (i) of configuration data that is to be stored in the flash memory array for configuring the programmable circuitry is read into local row latches located on the integrated circuit, such as in the flash programming circuitry. The configuration data may be read from the existing data in the flash memory array, from another location on the device (e.g., an on-board memory block), or from a source external to the device such as a ROM, PROM, hard drive, or any other storage medium, or via a network connection such as the internet. In embodiments where the data is read into the device from an off-chip data source, the on-chip intelligence may control the read-in of the data (e.g., with a data "fetch" type of operation). Next, at reference numeral 36, the flash memory cells in row (i) are programmed or erased by the flash programming circuitry 16 of FIG. 1 in accordance with the latched row data.

At reference numeral 38, it is determined whether the current row is the last row in the memory. If the current row is not the last row in the memory, the process proceeds to reference numeral 40, where the row count is incremented, and then on to repeat the current-row-operation at reference numeral 34. If, however, the current row was the last row in the memory, the integrated circuit is returned to normal operation at reference numeral 42.

Figure 3:
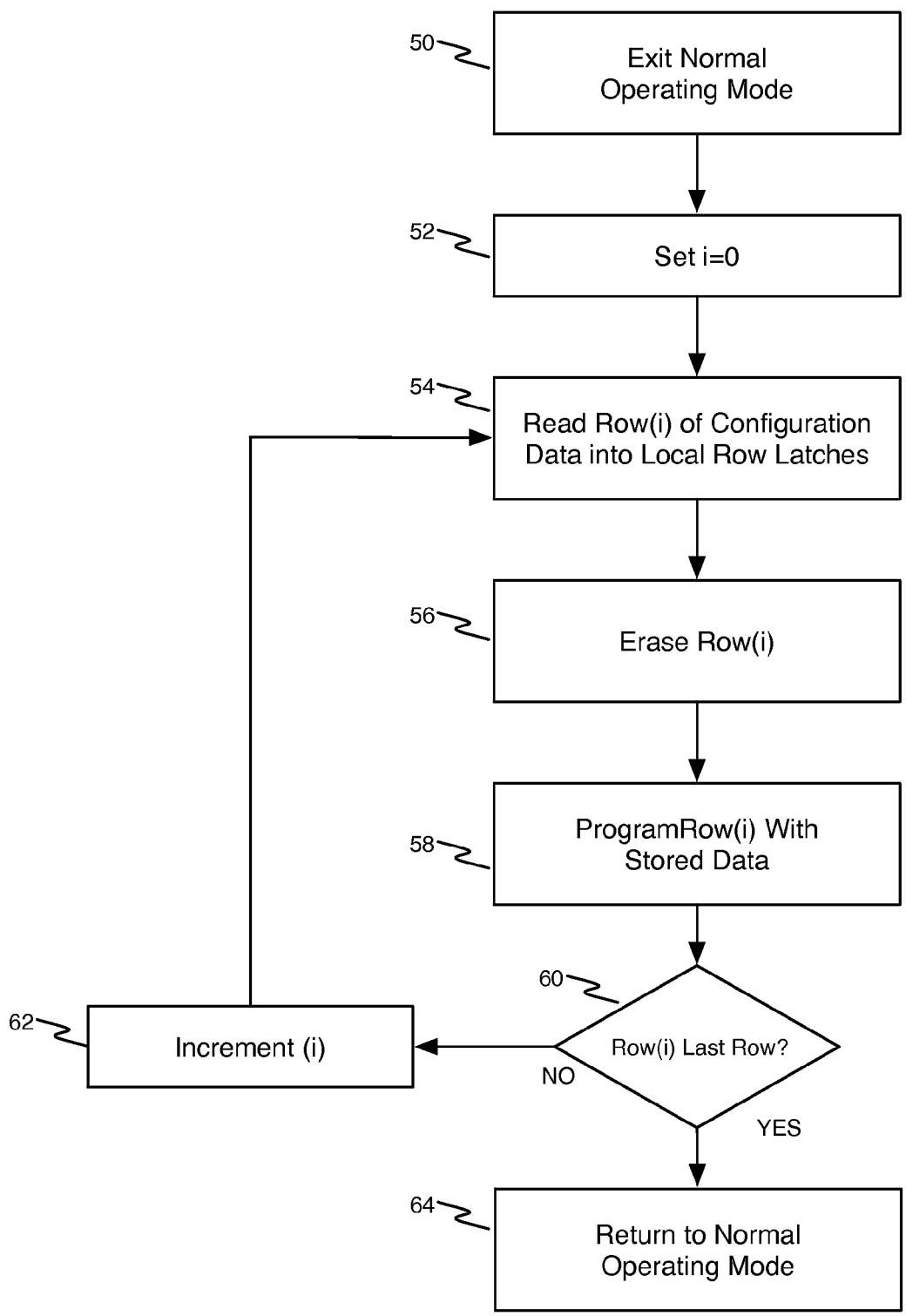
FIG. 3 is a flow chart illustrating a flash memory refresh method that may be used in the integrated circuit of FIG. 1 according to the present invention.

Referring now to FIG. 3, a flow chart illustrates a flash memory refresh method that may be used in the integrated circuit of FIG. 1 according to the present invention. First, at reference numeral 50, the integrated circuit is taken out of normal operating mode as was the case in the process illustrated in FIG. 2. Next, at reference numeral 52, the row count (i) is set to zero.

Next, a current-row-operation including several processes is performed. At reference numeral 54, row (i) of configuration data is read from the flash memory into the local row latches. Next, at reference numeral 56, all of the flash memory cells in row (i) are erased by the flash programming circuitry 16 of FIG. 1.

Next, at reference numeral 58, the cells of row (i) are programmed in accordance with the latched row data. Next, at reference numeral 60, it is determined whether the current row is the last row in the memory. If the current row is not the last row in the memory, the process proceeds to reference numeral 62, where the row count is incremented, and then on to repeat the current-row-operation. If, however, the current row was the last row in the memory, the integrated circuit is returned to normal operation at reference numeral 64.

Figure 4:
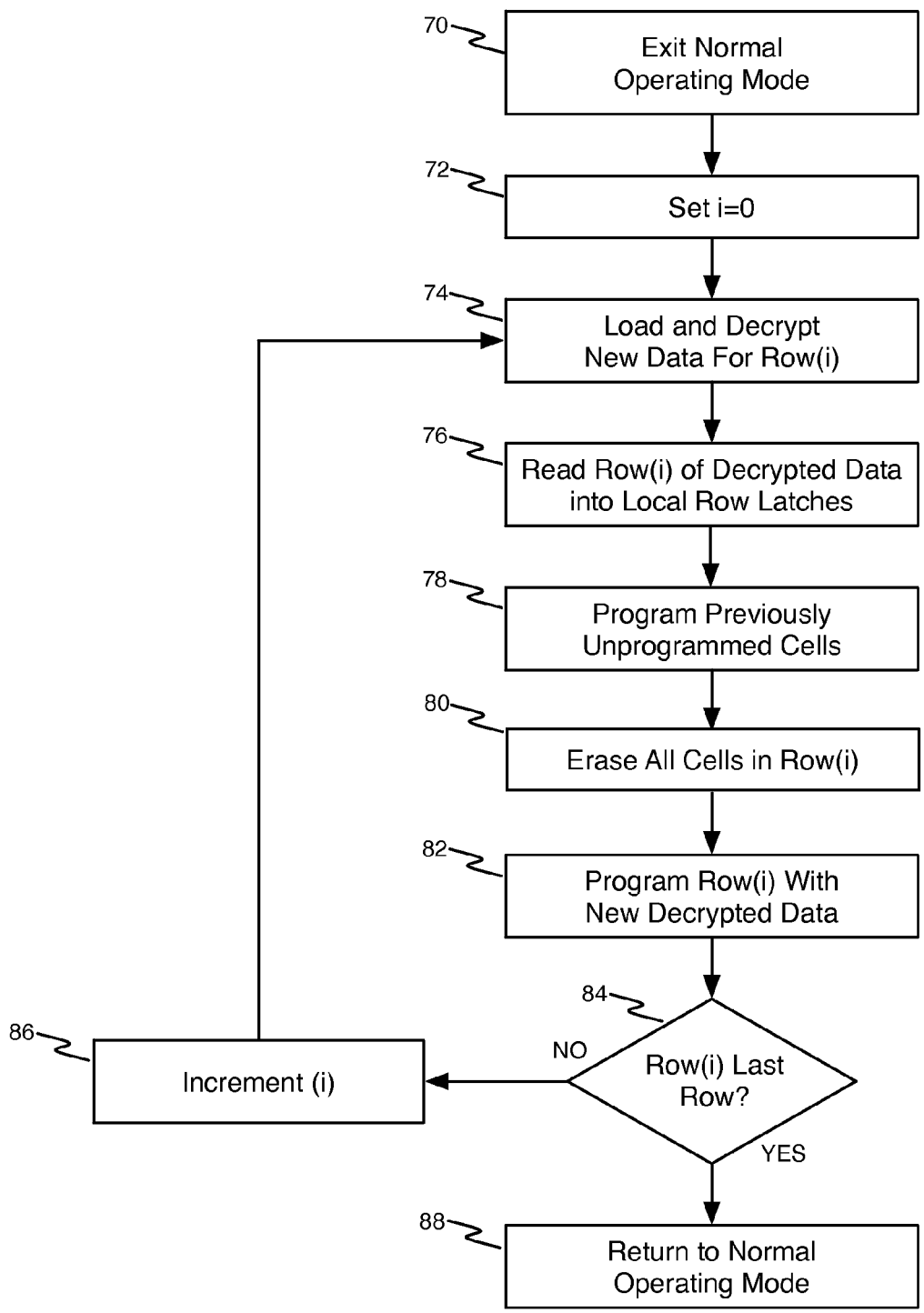
FIG. 4 is a flow chart illustrating a flash memory reprogramming method that may be used in the integrated circuit of FIG. 1 according to the present invention.

Referring now to FIG. 4, a flow chart illustrates a flash memory reprogramming method that may be used in the integrated circuit of FIG. 1 according to the present invention. First, at reference numeral 70, the integrated circuit is taken out of normal operating mode as was the case in the process illustrated in FIGS. 2 and 3. Next, at reference numeral 72, the row count (i) is set to zero.

Next, a current-row-operation including several processes is performed. At reference numeral 74, new data for the current row is loaded into the integrated circuit and then decrypted according to the decryption key stored in the integrated circuit. At reference numeral 76, the newly decrypted data for the current row is read into the local row latch associated with the memory. At reference numeral 78, memory cells in the current row that were previously unprogrammed are programmed, followed by erasing all of the cells in the current row at reference numeral 80. The programming and erasing of all cells is performed to assure an equal number of program and erase cycles for all flash cells regardless of previously-stored data. This insures better device tracking and reliability for the life of the part.

At reference numeral 82, the current row is programmed with the newly decrypted data stored in the local row latch. Then, at reference numeral 84, it is determined whether the current row is the last row in the memory. If the current row is not the last row in the memory, the process proceeds to reference numeral 86, where the row count is incremented, and then on to repeat the current-row-operation. If, however, the current row was the last row in the memory, the integrated circuit is returned to normal operation at reference numeral 88.

Persons of ordinary skill in the art will appreciate that there is some flexibility in the order in which the particular processes are performed in the flow diagram of FIG. 4. The order of the processes performed as indicated by reference numerals 74 and 76, and 78 and 80, respectively, is flexible, since it does not matter whether the selected row of memory cells is programmed and erased before or after the new row data is loaded and decrypted.

The present invention has several advantages over the prior art. There is no need for decrypted programming information external to the device eliminating the need for code storage and exposure of the programming code. In addition, there is no need for external system intelligence or a technician to reprogram the device.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit including:
  programmable circuitry;
  a flash data input I/O pad;
  a flash memory array coupled to the programmable circuitry for configuring the programmable circuitry;
  flash programming circuitry for programming the flash memory array;

on-chip intelligence coupled to the programming circuitry and to the flash data input pad, the on-chip intelligence including a decryption engine coupled to the flash data input I/O pad and storing a decryption key, the on-chip intelligence configured to refresh the data stored in the flash memory using data from one of data stored in the flash memory array and data entered onto the integrated circuit from the flash data input I/O pad and decrypted by the decryption engine.

2. The integrated circuit of claim 1 wherein the on-chip intelligence comprises a microcontroller.

3. The integrated circuit of claim 1 wherein the on-chip intelligence comprises a state machine.

4. The integrated circuit of claim 1 wherein the on-chip intelligence is further configured to take the integrated circuit out of a normal operating mode prior to refreshing the data stored in the flash memory array.

5. The integrated circuit of claim 1 wherein the on-chip intelligence includes:
means for taking the integrated circuit out of normal operating mode;
means for performing a current row operation including:
means for reading the current row configuration data from the memory into local row latches;
means for erasing flash memory cells in the row;
means for programming the memory cells in the current row from the latched row configuration data;
means for determining whether the current row is not the last row in the memory, and for performing the current row operation on the next row to be refreshed if the current row is not the last row in the memory; and
means for returning the integrated circuit to normal operation if the current row was the last row to be refreshed.

6. The method of claim 5, further comprising:
means for setting a row counter to zero;
means for determining whether the current row is the last row in the memory after programming the memory cells in the current row;
means for incrementing the row count and repeating performance of the current row operation if the current row is not the last row in the memory.

7. The method of claim 6, further comprising means for programming any previously unprogrammed memory cells in the current row before erasing all the flash memory cells in the row.

8. The integrated circuit of claim 1 wherein the on-chip intelligence includes:
means for taking the integrated circuit out of normal operating mode;
means for performing a current row operation including:
means for erasing flash memory cells in the row;
means for loading and decrypting encrypted row configuration data for the current row;
means for programming the memory cells in the current row from the loaded and decrypted row configuration data;
means for performing the current row operation on the next row to be reprogrammed if the current row is not the last row to be reprogrammed; and
means for returning the integrated circuit to normal operation if the current row was the last row to be reprogrammed.

9. The method of claim 8, further comprising:
means for setting a row counter to zero;
means for determining whether the current row is the last row in the memory after programming the memory cells in the current row; and
means for incrementing the row count and repeating performance of the current row operation if the current row is not the last row in the memory.

10. The method of claim 9, further comprising means for programming any previously unprogrammed memory cells in the current row before erasing all the flash memory cells in the row.

* * * * *